United States Patent
Arnold et al.

(10) Patent No.: US 11,189,528 B2
(45) Date of Patent: Nov. 30, 2021

(54) SUBTRACTIVE RIE INTERCONNECT

(71) Applicant: INTERNATIONAL BUSINESS MACHINES CORPORATION, Armonk, NY (US)

(72) Inventors: John Christopher Arnold, North Chatham, NY (US); Balasubramanian S. Pranatharthi Haran, Watervliet, NY (US); Takeshi Nogami, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/855,438

(22) Filed: Apr. 22, 2020

(65) Prior Publication Data

US 2021/0335665 A1    Oct. 28, 2021

(51) Int. Cl.
| | |
|---|---|
| *H01L 21/768* | (2006.01) |
| *H01L 23/522* | (2006.01) |
| *H01L 23/528* | (2006.01) |
| *H01L 23/532* | (2006.01) |
| *H01L 21/3213* | (2006.01) |

(52) U.S. Cl.
CPC .. *H01L 21/76892* (2013.01); *H01L 21/32136* (2013.01); *H01L 21/32139* (2013.01); *H01L 21/76802* (2013.01); *H01L 21/76843* (2013.01); *H01L 21/76877* (2013.01); *H01L 23/5226* (2013.01); *H01L 23/5283* (2013.01); *H01L 23/53252* (2013.01)

(58) Field of Classification Search
CPC .......... H01L 21/76892; H01L 23/5283; H01L 23/5226; H01L 21/32139; H01L 21/32136; H01L 21/76843; H01L 21/76802; H01L 21/76877; H01L 23/53252
See application file for complete search history.

(56) References Cited

U.S. PATENT DOCUMENTS

| | | | |
|---|---|---|---|
| 5,512,514 A | 4/1996 | Lee | |
| 5,691,238 A | 11/1997 | Avanzino et al. | |
| 5,773,365 A | 6/1998 | Ito | |
| 6,617,239 B1* | 9/2003 | Farrar | H01L 21/76802 257/E21.576 |
| 8,299,625 B2 | 10/2012 | Ponoth et al. | |
| 8,357,609 B2 | 1/2013 | Ryan | |
| 9,601,426 B1 | 3/2017 | Bonilla et al. | |
| 9,613,861 B2 | 4/2017 | Anderson et al. | |
| 10,177,031 B2 | 1/2019 | Bao et al. | |
| 10,580,696 B1* | 3/2020 | Lin | H01L 21/76883 |

(Continued)

*Primary Examiner* — Karen Kusumakar
(74) *Attorney, Agent, or Firm* — Tutunjian & Bitetto, P.C.; L. Jeffrey Kelly

(57) ABSTRACT

A method is presented for constructing interconnects by employing a subtractive etch process. The method includes forming a plurality of first conductive lines within an interlayer dielectric, depositing dielectric layers over the plurality of first conductive lines, depositing a photoresist layer over the dielectric layers, patterning the photoresist layer to create vias to top surfaces of one or more of the plurality of first conductive lines, and depositing a conductive material such that the conductive material fills the vias and provides for a sheet of metal for second conductive lines formed above the first conductive lines.

20 Claims, 5 Drawing Sheets

(56) References Cited

U.S. PATENT DOCUMENTS

2015/0348832 A1 12/2015 Bruce et al.
2017/0040213 A1 2/2017 Bruce et al.
2019/0363063 A1* 11/2019 May .................... H01L 23/5226

* cited by examiner

SUBTRACTIVE RIE INTERCONNECT

BACKGROUND

The present invention relates generally to semiconductor devices, and more specifically, to a subtractive reactive ion etch interconnect and its formation.

Integrated circuits commonly include electrically conductive microelectronic structures, known as vias, to electrically connect metal lines or other interconnects above the vias to metal lines or other interconnects below the vias. Vias are usually formed by a lithographic process. Representatively, a photoresist layer can be spin coated over a dielectric layer, the photoresist layer can be exposed to patterned actinic radiation through a patterned mask, and then the exposed layer can be developed in order to form an opening in the photoresist layer. Next, an opening for the via can be etched in the dielectric layer by using the opening in the photoresist layer as an etch mask. This opening is referred to as a via opening. The via opening can be filled with one or more metals or other conductive materials to form the via. Via opening misalignment, however, can cause a reduction in level-to-level contact area, thus increasing via resistance, which is undesirable.

SUMMARY

In accordance with an embodiment, a method is provided for constructing interconnects by employing a subtractive etch process. The method includes forming a plurality of first conductive lines within an interlayer dielectric, depositing dielectric layers over the plurality of first conductive lines, depositing a photoresist layer over the dielectric layers, patterning the photoresist layer to create vias to top surfaces of one or more of the plurality of first conductive lines, and depositing a conductive material such that the conductive material fills the vias and provides for a sheet of metal for second conductive lines formed above the first conductive lines.

In accordance with another embodiment, a method is provided for constructing interconnects by employing a subtractive etch process. The method includes depositing a dielectric material over a plurality of lower conductive lines, forming openings through the dielectric material to top surfaces of one or more of the plurality of lower conductive lines, and forming metal vias and upper conductive lines with a single deposition of a conductive material such that the metals vias and the upper conductive lines define one continuous structure.

In accordance with yet another embodiment, a semiconductor structure is provided for constructing interconnects by employing a subtractive etch process. The semiconductor structure includes a plurality of lower level conductive lines disposed within an interlayer dielectric, dielectric layers disposed over the plurality of lower level conductive lines, and a conductive material extending through the dielectric layers and over one or more of the plurality of lower level conductive lines, wherein the conductive material defines metal vias and provides for a sheet of metal for upper level conductive lines formed above the plurality of lower level conductive lines.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
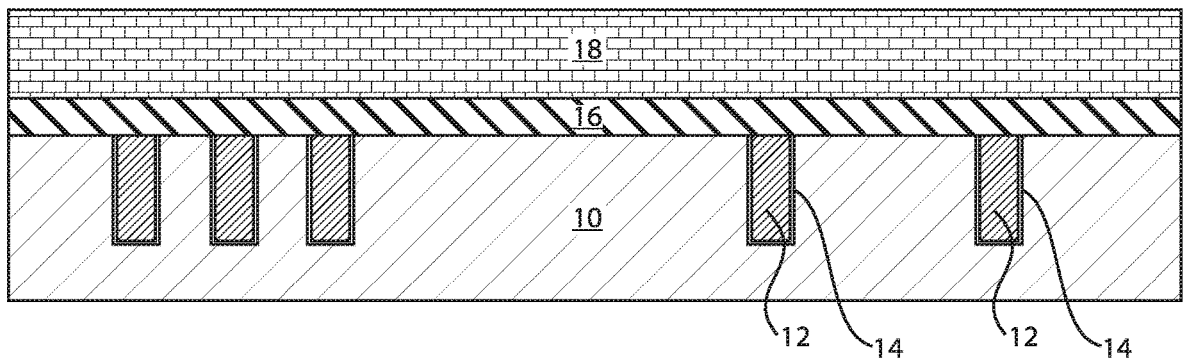
FIG. 1 is a cross-sectional view of a semiconductor structure including a plurality of conductive lines formed within a dielectric layer, in accordance with an embodiment of the present invention.

Embodiments in accordance with the present invention provide methods and devices for constructing an interconnect structure by subtractive reactive ion etch (RIE).

With the 7 nm technology node in the development phase and the 5 nm node moving into development, transistor scaling gets ever more complex. On top of that, performance benefits gained at the front-end-of-line (e.g., the transistors) can easily be undone if similar improvements are not made in the back-end-of-the-line (BEOL). BEOL processing involves the creation of stacked layers of metal wires that electrically interconnect transistors in a chip. With each technology node, this metal wiring scheme becomes more complex, mainly because there are more transistors to connect with an ever tighter pitch. Shrinking dimensions also means the wires have a reduced cross-sectional area, which drives up the resistance-capacitance product (RC) of the interconnect system.

Metal-based dual damascene has been the workhorse process flow for interconnects. The metal can be, e.g., copper (Cu). A simple dual damascene flow starts with deposition of a low-k dielectric material on a structure. These low-k films are designed to reduce the capacitance and the delay in the integrated circuits (ICs). In a next step, this dielectric layer is covered with an oxide and a resist, and vias and trenches are formed using lithography and etch steps. These vias connect one metal layer with the layer above or below. Then, a metallic barrier layer is added to prevent metal atoms from migrating into the low-k materials. The barrier layers are deposited with, e.g., physical vapor deposition (PVD), using materials such as, e.g., tantalum and tantalum nitride. In a final step, this structure is seeded, electroplated with a metal (usually Cu), followed by a chemical mechanical planarization (CMP) step.

In order to overcome limitations of copper damascene processes, two approaches have been introduced, that is, employing single damascene copper interconnects and employing subtractive RIE interconnect formation. However, the single damascene process presents issues in lithography for upper level metal lines, as they are sometimes misaligned with respect to the vias. Such misalignment of lines to vias causes too short of a distance of misaligned lines to the neighboring vias that can lead to Tmax and time-dependent dielectric breakdown (TDDB) issues for circuits.

The exemplary embodiments of the present invention form one body of metal via and trench in the subtractive RIE metal line formation. The vias are formed through a metal gap fill in via holes without employing damascene via chemical mechanical planarization (CMP) processes. The metal films formed on the field during the via metal fill process become a part or the whole of the upper level metal lines and the subtractive RIE for metal line formation over-etches the metal of vias which are exposed to RIE due to the misalignment of the metal line to the via. As a result, the upper metal lines and vias have no interface or junction, and sections of misaligned vias are etched away during over-etching of subtractive RIE to create a suitable distance for Vmax and TDDB. The subtractive RIE metal lines can thus be formed with vias to resolve high line resistance issues.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a plurality of conductive lines formed within a dielectric layer, in accordance with an embodiment of the present invention.

A semiconductor structure 5 includes a plurality of conductive lines 12 formed within trenches of an inter-layer dielectric (ILD) 10. A conductive liner 14 can be formed or deposited around each of the trenches. The ILD 10 can include any materials known in the art, such as, for example, porous silicates, carbon doped oxides, silicon dioxides, silicon nitrides, silicon oxynitrides, or other dielectric materials. The ILD 10 can be formed using any method known in the art, such as, for example, chemical vapor deposition, plasma enhanced chemical vapor deposition, atomic layer deposition, or physical vapor deposition. The ILD 10 can have a thickness ranging from about 25 nm to about 200 nm.

The dielectric material of layer 10 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

One example of a material suitable for the low-k materials for the low-k dielectric layer 10 can include silicon oxycarbonitride (SiOCN). Other low-k materials that can also be used for the low-k material layer 10 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 10 can be conformally deposited over a substrate (not shown) using CVD. Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

The metal lines 12 can be formed in the openings or trenches formed in the ILD 10. The metal lines 12 can be any conductive materials known in the art, such as, for example, copper (Cu), aluminum (Al), tungsten (W), ruthenium (Ru) or cobalt (Co). The metal lines 12 can be fabricated using any technique known in the art, such as, for example, a single or dual damascene technique.

A first dielectric material 16 can be deposited over the conductive lines 12. A second dielectric material 18 can be deposited over the first dielectric material 16. The thickness of the second dielectric layer 18 can be greater than the thickness of the first dielectric layer.

Non-limiting examples of suitable dielectric materials 16, 18 include silicon dioxide, SiCOH, OMCTS, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

Figure 2:
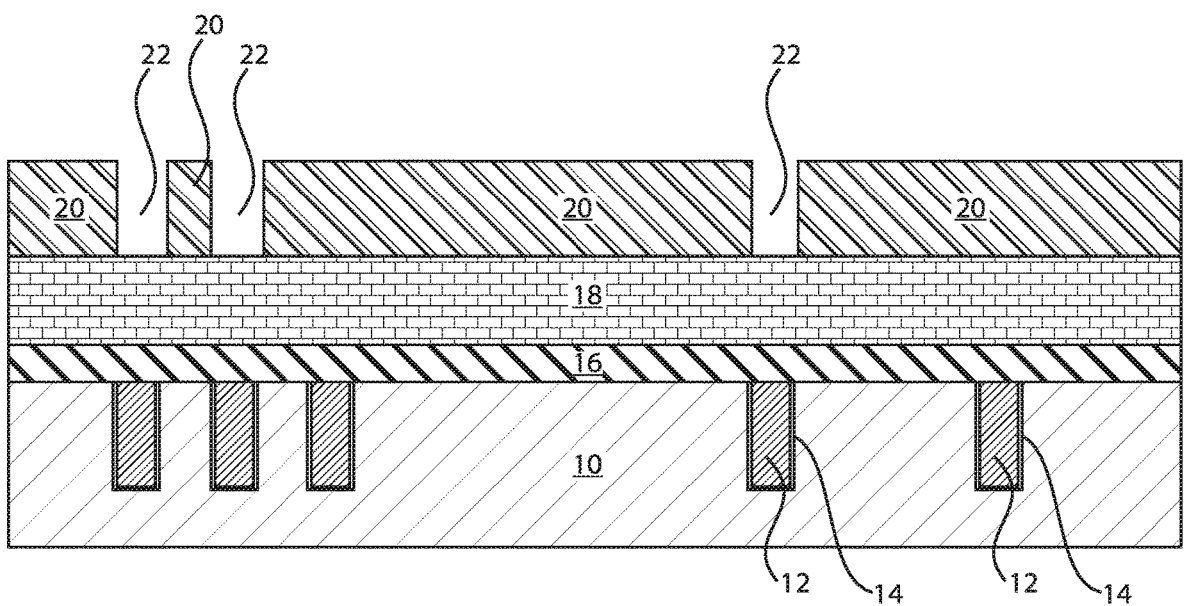
FIG. 2 is a cross-sectional view of the semiconductor structure of FIG. 1 where via lithography takes place, in accordance with an embodiment of the present invention.

FIG. 2 is a cross-sectional view of the semiconductor structure of FIG. 1 where via lithography takes place, in accordance with an embodiment of the present invention.

In various example embodiments, a photoresist layer 20 is deposited over the dielectric layer 18. A photolithography process usually includes applying a layer of photoresist material 20 (e.g., a material that will react when exposed to light), and then selectively exposing portions 22 of the photoresist 20 to light or other ionizing radiation (e.g., ultraviolet, electron beams, X-rays, etc.), thereby changing the solubility of portions of the material. The resist 20 is then developed by washing the resist with a developer solution, such as, e.g., tetramethylammonium hydroxide (TMAH), thereby removing non-irradiated (in a negative resist) or irradiated (in a positive resist) portions of the resist layer.

Figure 3:
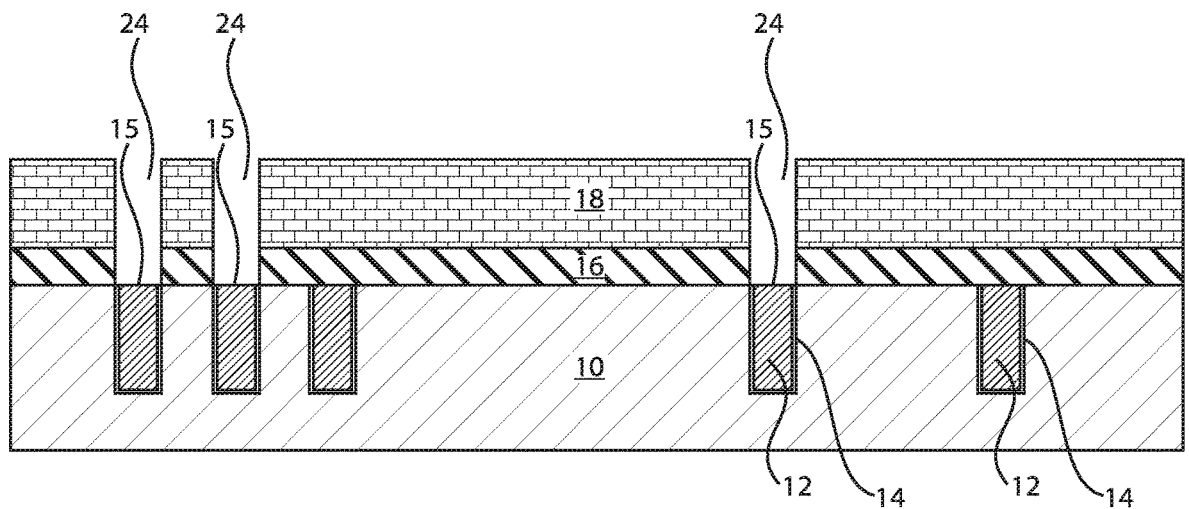
FIG. 3 is a cross-sectional view of the semiconductor structure of FIG. 2 where via reactive ion etch (RIE) is performed to expose a top surface of one or more of the conductive lines, in accordance with an embodiment of the present invention.

FIG. 3 is a cross-sectional view of the semiconductor structure of FIG. 2 where via reactive ion etch (RIE) is performed to expose a top surface of one or more of the conductive lines, in accordance with an embodiment of the present invention.

In various example embodiments, via RIE is performed to expose a top surface 15 of one or more of the conductive lines 12. The RIE creates openings or vias 24 over exposed conductive lines 12. The vias 24 extend through the second dielectric layer 18 and the first dielectric layer 16. Stated differently, the vias 24 are formed between vertical portions of the dielectric layers 16, 18.

Figure 4:
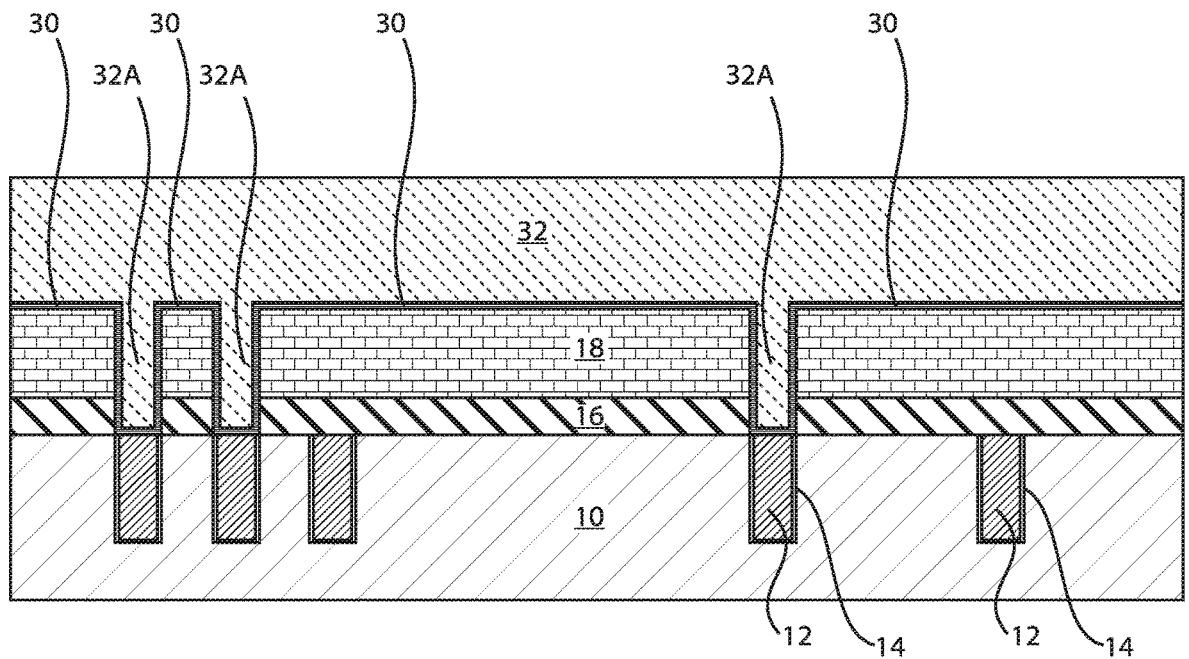
FIG. 4 is a cross-sectional view of the semiconductor structure of FIG. 3 where a metal fill is performed, in accordance with an embodiment of the present invention.

FIG. 4 is a cross-sectional view of the semiconductor structure of FIG. 3 where a metal fill is performed, in accordance with another embodiment of the present invention.

In various example embodiments, a conductive liner 30 is deposited and a conductive material 32 is deposited over the conductive liner 30. Conductive material regions 32A can be formed within the openings or vias 24. The conductive material regions 32A are vertically aligned with the exposed conductive lines 12. The conductive material regions 32A are formed between the first and second dielectric layers 16, 18.

Figure 7:
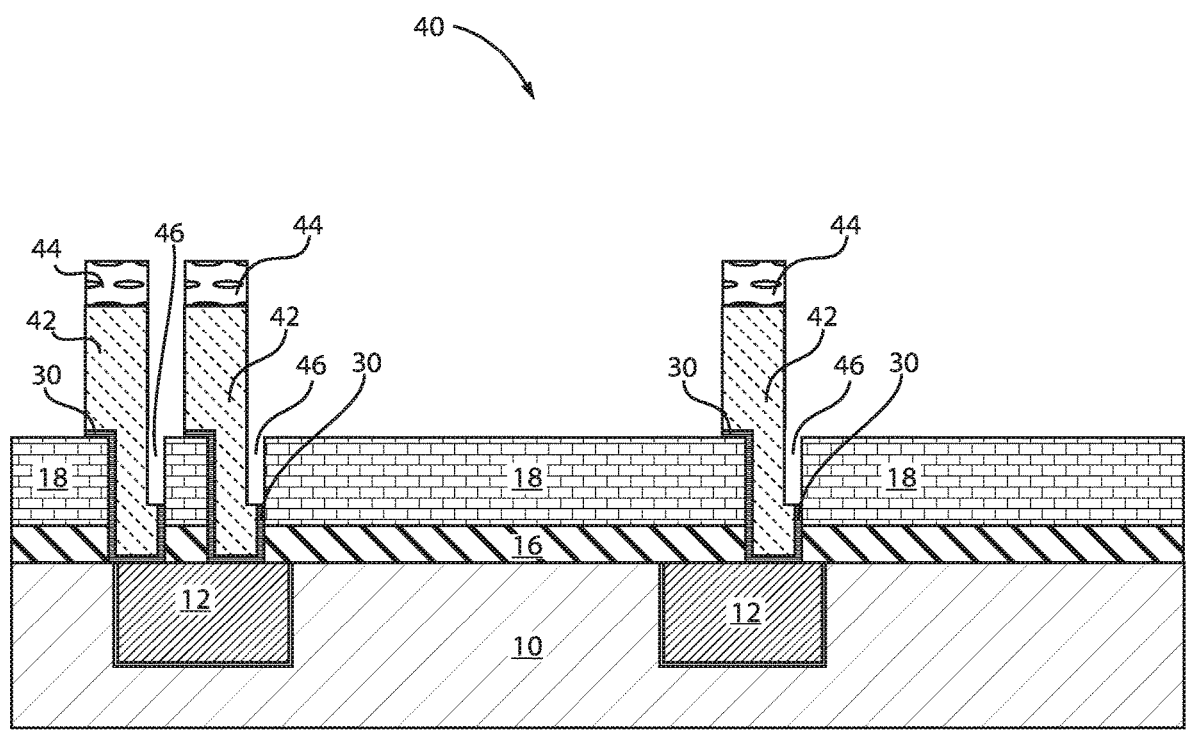
FIG. 7 is a cross-sectional view of the semiconductor structure of FIG. 6 illustrating over-etch in upper metal RIE to etch away misaligned via parts, in accordance with an embodiment of the present invention.

The conductive material 32 extends over an entirety of the second dielectric layer 18. The conductive material 32 forms a sheet of metal across a wafer surface. The sheet of metal 32 allows for the forming of metal lines above the vias 24 (FIG. 7). Thus, the vias 24 and the metal lines above are formed from a single deposited conductive material. As a result, there are no interfaces between them (FIG. 7).

The conductive liner 30 can be, e.g., titanium (Ti), whereas the conductive material 32 can be, e.g., ruthenium.

Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. The conductive metal can be deposited by a suitable deposition process, for example, CVD, PECVD, PVD, plating, thermal or e-beam evaporation.

Figure 5:
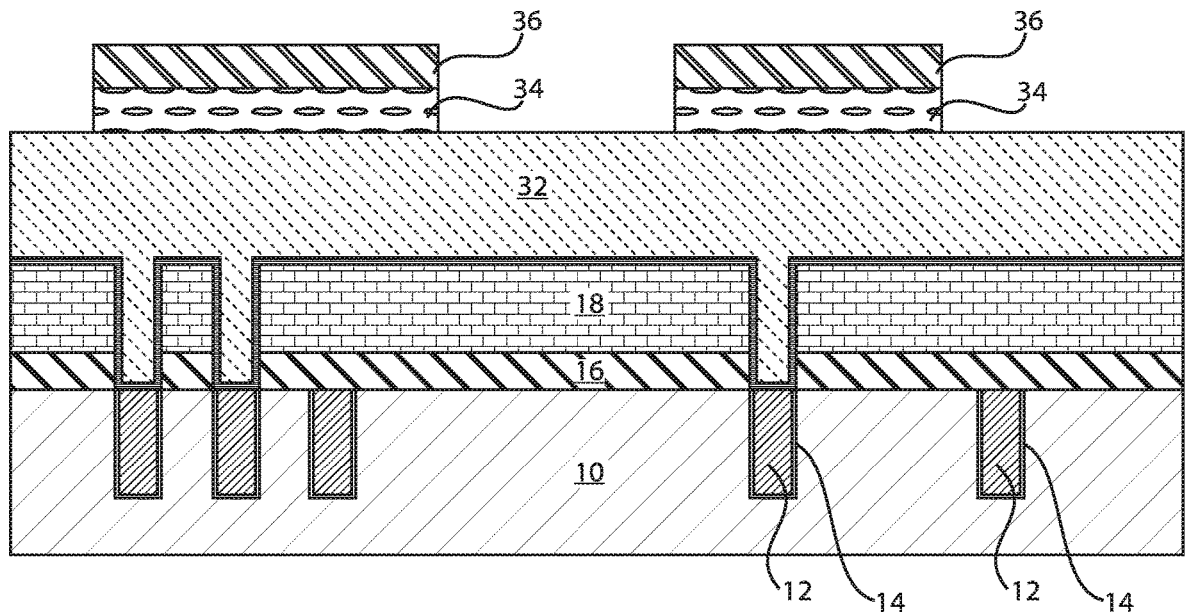
FIG. 5 is a cross-sectional view of the semiconductor structure of FIG. 4 illustrating metal line lithography, in accordance with an embodiment of the present invention.

FIG. 5 is a cross-sectional view of the semiconductor structure of FIG. 4 illustrating metal line lithography, in accordance with an embodiment of the present invention.

In various example embodiments, a hardmask layer 34 and a photoresist layer 36 are deposited over the conductive material 32. The hardmask layer 34 and the photoresist layer 36 are patterned such that sections remain over at least the conductive material regions 32A, which are vertically aligned with the exposed conductive lines 12. Of course, sections of the hardmask layer 34 and photoresist layer 36 remain over all the area required by the circuit design.

In various embodiments, the hardmask layer 34 can be a nitride, for example, a silicon nitride (SiN), an oxynitride, for example, silicon oxynitride (SiON), or a combination thereof. In other embodiments, the hardmask layer 34 can be, e.g., a metal, a semiconductor, or a stack of materials that can withstand subsequent etch of conductive material 32. In a preferred embodiment, the hardmask layer 34 can be silicon nitride (SiN), for example, $Si_3N_4$.

In one or more embodiments, the hardmask layer 34 can have a thickness in the range of about 10 nm to about 100 nm, or in the range of about 35 nm to about 75 nm, or in the range of about 45 nm to about 55 nm, although other thicknesses are contemplated.

The photoresist layer 36 is deposited as a blanket layer atop the hardmask layer 34, for example, by spin coating.

The photoresist layer 36 can include any organic photoresist material such as, for example, methacrylates or polyesters. The photoresist layer 36 can have a thickness from about 30 nm to about 500 nm, although lesser and greater thicknesses can also be employed.

In various example embodiments, the hardmask layer 34 is etched. The etch can, for example, include a wet etch such as a phosphoric acid ($H_3PO_4$) (wet chemistry) etch or a diluted hydrogen fluoride (HF) etch.

Figure 6:
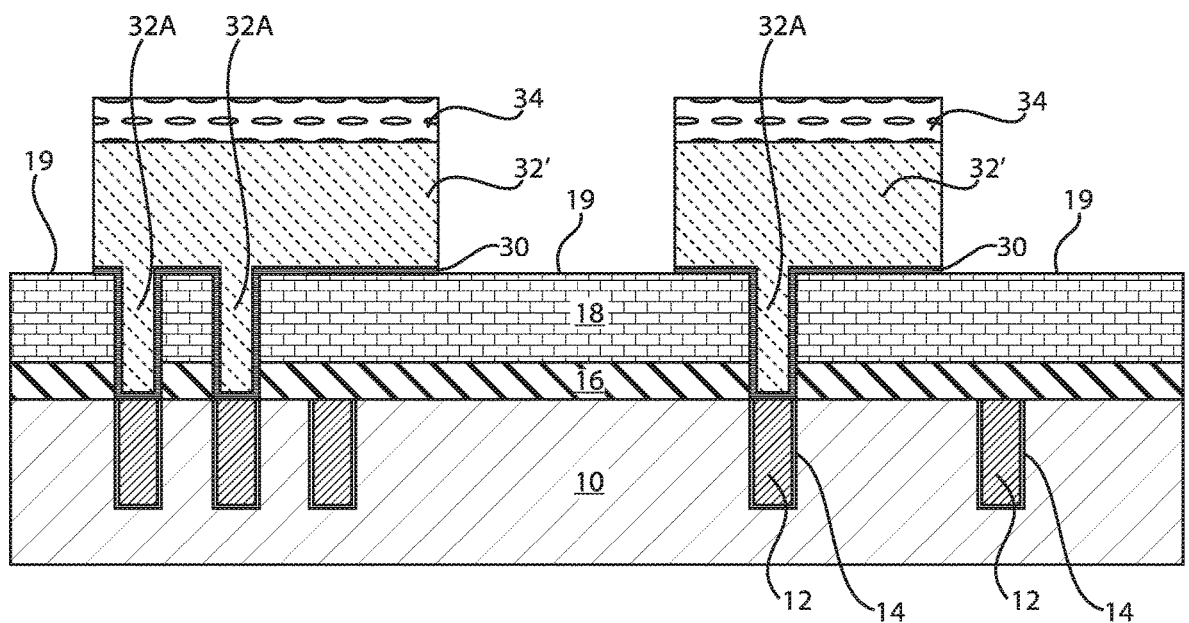
FIG. 6 is a cross-sectional view of the semiconductor structure of FIG. 5 illustrating upper metal RIE, in accordance with an embodiment of the present invention.

FIG. 6 is a cross-sectional view of the semiconductor structure of FIG. 5 illustrating upper metal RIE, in accordance with an embodiment of the present invention.

In various example embodiments, the conductive material 32 is etched to expose a top surface 19 of the second conductive material 18. Additionally, the photoresist layer 36 is removed. The remaining conductive material is designated as 32'. The remaining conductive material 32' is located beneath the hardmask layer 34. The conductive material regions 32A remain intact.

FIG. 7 is a cross-sectional view of the semiconductor structure of FIG. 6 illustrating over-etch in upper metal RIE to etch away misaligned via parts, in accordance with an embodiment of the present invention.

In various example embodiments, the hardmask layer 34 and the remaining conductive material 32' are etched. The structure 40 illustrates over-etching to etch away misaligned via portions or sections. In structure 40, conductive material 42 (combination of upper metal lines and via metal) has a substantially Z-shaped or irregular shaped configuration. The conductive material 42 defines upper level conductive lines, as well as the via metal fill. As a result, the upper metal lines and the vias have no interface or junction therebetween. In other words, the conductive material 42 fills the via openings 24 and concurrently provides for a sheet of metal to form upper metal lines. As a result, the metal vias and the upper metal lines are formed in a single deposition step.

The conductive liner 30 directly contacts select upper surfaces of the conductive lines 12. The conductive material 42 remains within the confines of the lower conductive liner 30 such that an opening 46 is formed between the conductive material 42 and the second dielectric layer 18. A hardmask portion 44 remains over the conductive material 42.

The over-etch is illustrated by the opening 46. The opening 46 does not extend to the top surface of the conductive lines 12. Instead, a lower portion of the conductive material remains over the conductive lines 12 to avoid misalignment between the via metal and the conductive lines 12. In other words, conductive material 42 includes an upper portion and a lower portion. The upper portion can be defined as above the top surface of dielectric layer 18 and the lower portion can be defined as below the dielectric layer 18. Thus, in one instance, the top surface of the dielectric layer 18 can act as an imaginary boundary for visualizing the separation between the upper metal lines and the via metal. However, in use, the upper metal lines and the via metal is one uniform, continuous, non-interrupted conductive material 42.

Stated differently, the etch line is carried below the top dielectric layer 18 to create greater spacing between adjacent lines. So, the top via section is driven down below the top surface of the second dielectric layer 18 to create such greater spacing between adjacent lines.

Consequently, an interconnect structure 40 can be formed by etching vias through dielectric layers 16, 18 to connect with existing lower conductive lines 12 below, followed by a single deposition of conductive material 42 to fill the vias and concurrently form a sheet of metal across the wafer surface, by employing subtractive patterning of the metal sheet to form the next level (or upper level) of conductive lines. Therefore, structure 40 avoids CMP stress and damage on via metal, in contrast to single damascene processes. Additionally, structure 40 minimizes risk of TDDB between via and metal line above, in contrast to independent lithographic alignment of vias and lines. Further, structure 40 improves via metal fill by presenting a lower aspect ratio during deposition, in contrast to dual damascene processes.

Figure 8:
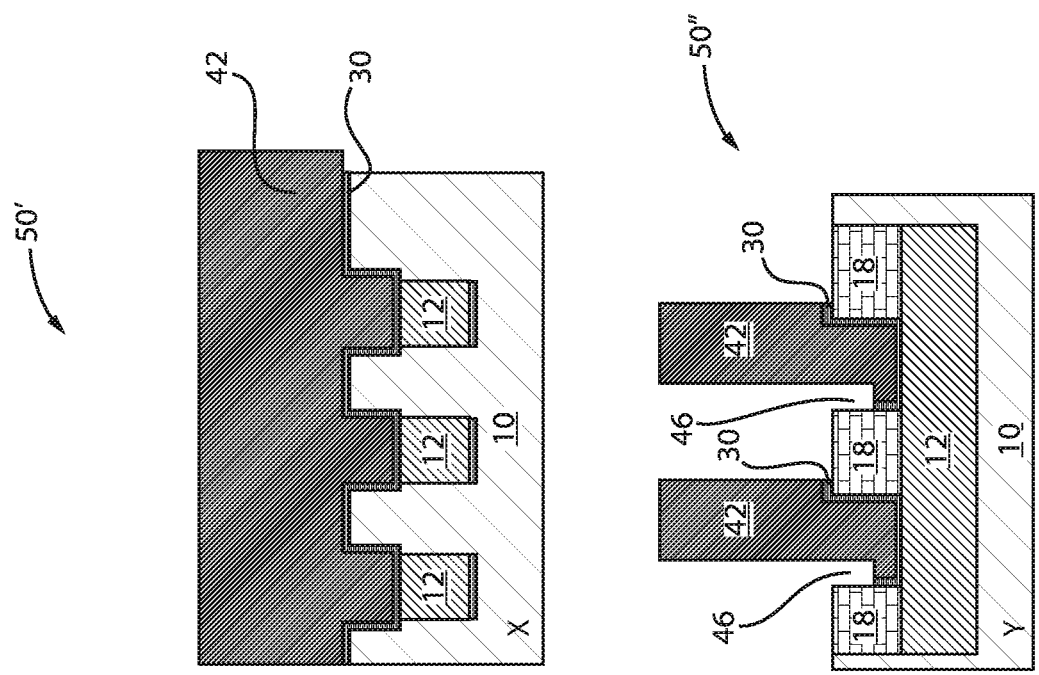
FIG. 8 illustrates multiple views of the interconnect structure, in accordance with an embodiment of the present invention.
Figure 8:
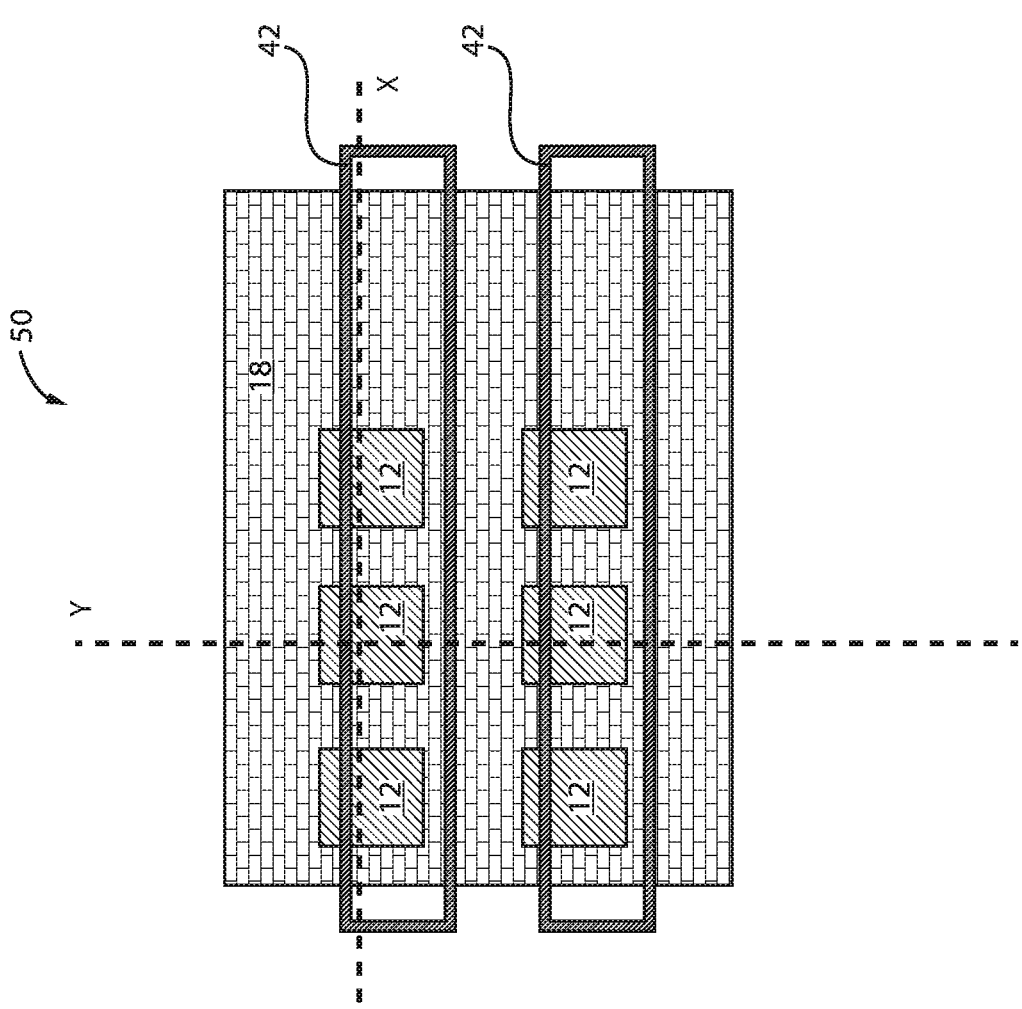

FIG. 8 illustrates multiple views of the interconnect structure, in accordance with an embodiment of the present invention.

In various example embodiments, top view 50 illustrates the conductive material placed over one or more conductive lines 12. Additionally, only portions of lines 12 are visible through the via openings in top view 50.

In view 50' along axis X, the conductive material 42 is shown formed over the conductive lines 12. View 50' illustrates the formation of one body of metal via and trench in the subtractive RIE metal line formation of interconnect formation processes.

In view 50" along the Y-axis, the over-etching area 46 is visible. The lower section of the conducting material 42 extends over an entire upper surface of the conductive line 12.

Therefore, the exemplary embodiments of the present invention depict self-alignment of vias below to metal lines above through simultaneous filling of pre-formed vias and overburden followed by subtractive etching of metal lines above. The mixing of an additive via metal deposition with a subtractive line formation is employed. Further, vias are pre-formed in dielectric layers, then a conductive material or metal is deposited both to fill the via and to provide a sheet of metal for forming the metal lines above (upper metal lines). Thus, the vias and the metal lines above are formed from the same deposited conductive material, so there are no interfaces or junctions between them. Moreover, after the via fill with metal, the metal film on the field is not removed by CMP, but becomes a part or the whole body of the upper metal lines (view 50'). The upper metal lines are thus formed by subtractive RIE, whereas the vias are formed by non-subtractive RIE. Stated differently, subtractive RIE metal lines and the vias below are formed of one body of metal without a junction or interface between them (view 50').

In summary, the exemplary embodiments include the formation of one body of metal via and trench in the subtractive RIE metal line formation in interconnect formation processes. Vias are formed through metal gap fill in via holes without following damascene via CMP processes. The metal films formed on the field during the via metal fill process become a part or the whole of the upper level metal lines and the subtractive RIE for metal line formation over-etches the metal of vias, which are exposed to RIE due to the misalignment of the metal line to via.

The advantages of the exemplary embodiments of the present invention are at least that the upper metal lines and vias have no interface or no junction therebetween. The misaligned via sections or portions are etched away during the over-etching of subtractive RIE to create a distance acceptable enough for Vmax and TDDB to meet circuit requirements. The subtractive RIE metal lines which are not possible in conventional approaches can be formed with vias to resolve the high line resistance and reliability issues. Manufacturing yield which is not attainable by conventional approaches is attained by the exemplary embodiments of the present invention because of the low aspect ratio via fill process.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

Regarding FIGS. 1-7, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

A pre-clean wet etch process, such as a buffered hydrofluoric acid (BHF) etch, is a material removal process that uses liquid chemicals or etchants to remove materials from a surface. BHF is a mixture of a buffering agent and hydrofluoric acid (HF). The buffering agent provides a greater process control than HF alone and can be, for example, ammonium fluoride ($NH_4F$). Wet etch processes, such as BHF, can advantageously remove native silicon oxide or silicon nitride films during an epitaxy pre-clean.

A pre-clean dry etch process, such as, for example, an in-situ pre-clean etch process, uses an in-situ remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The resulting etch is largely conformal and selective towards silicon oxide layers but does not readily etch silicon regardless of whether the silicon is amorphous, crystalline or polycrystalline. This selectivity provides advantages for applications such as shallow trench isolation (STI) and ILD recess formation and cleaning. A dry etch process can produce solid by-products which grow on the surface of the substrate as substrate material is removed. These solid by-products can be subsequently removed via sublimation when the temperature of the substrate is raised.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS.

is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments for methods and devices for a subtractive reactive ion etch interconnect and its formation (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for constructing interconnects by employing a subtractive etch process, the method comprising:
    forming a plurality of first conductive lines within an interlayer dielectric (ILD);
    depositing dielectric layers over the plurality of first conductive lines;
    depositing a photoresist layer over the dielectric layers;
    patterning the photoresist layer to create vias to top surfaces of one or more of the plurality of first conductive lines extending within the ILD; and
    depositing a conductive material such that an over-etch opening is defined.

2. The method of claim 1, wherein the dielectric layers include a first dielectric layer and a second dielectric layer.

3. The method of claim 2, wherein the first dielectric layer directly contacts a top surface of the plurality of first conductive lines.

4. The method of claim 1, wherein a conductive liner is deposited before depositing the conductive material.

5. The method of claim 4, wherein the conductive liner includes titanium (Ti) and the conductive material includes ruthenium (Ru).

6. The method of claim 1, wherein the conductive material defines a Z-shaped configuration after subtractive patterning.

7. The method of claim 1, wherein via metal fill is improved by presenting a lower aspect ratio during deposition of the conductive material.

8. The method of claim 1, wherein the over-etch opening is defined directly between at least one of the dielectric layers and the conductive material.

9. The method of claim 8, wherein the over-etch opening creates a greater spacing between adjacent lines.

10. The method of claim 1, wherein the second conductive lines and the vias have no interface or junction therebetween.

11. The method of claim 1, wherein the vias are formed through the dielectric layers.

12. A method for constructing interconnects by employing a subtractive etch process, the method comprising:
    depositing a dielectric material over a plurality of lower conductive lines formed within an interlayer dielectric (ILD);
    forming openings through the dielectric material to top surfaces of one or more of the plurality of lower conductive lines extending within the ILD; and
    forming metal vias and upper conductive lines with a single deposition of a conductive material such that the metals vias and the upper conductive lines define one continuous structure, the deposition of the conductive material defining an over-etch opening.

13. The method of claim 12, wherein a conductive liner is deposited before depositing the conductive material.

14. The method of claim 13, wherein the conductive liner includes titanium (Ti) and the conductive material includes ruthenium (Ru).

15. The method of claim 12, wherein the conductive material defines a Z-shaped configuration after subtractive patterning.

16. The method of claim 12, wherein the conductive material provides a sheet of metal across a wafer surface.

17. The method of claim 12, wherein the over-etch opening is defined directly between at least one of the dielectric layers and the conductive material.

18. The method of claim 17, wherein the over-etch opening creates a greater spacing between adjacent metal lines.

19. A semiconductor structure for constructing interconnects by employing a subtractive etch process, the semiconductor structure comprising:
    a plurality of lower level conductive lines disposed within an interlayer dielectric (ILD);
    dielectric layers disposed over the plurality of lower level conductive lines; and
    a conductive material extending through the dielectric layers and over one or more of the plurality of lower level conductive lines extending within the ILD, wherein the conductive material defines metal vias and provides for a sheet of metal for upper level conductive lines formed above the plurality of lower level conductive lines, the deposition of the conductive material defining an over-etch opening.

20. The semiconductor structure of claim 19, wherein the conductive material defines a Z-shaped configuration.

* * * * *